(12) United States Patent
Kaltalioglu

(10) Patent No.: US 8,159,254 B2
(45) Date of Patent: Apr. 17, 2012

(54) CRACK SENSORS FOR SEMICONDUCTOR DEVICES

(75) Inventor: Erdem Kaltalioglu, Newburgh, NY (US)

(73) Assignee: Infineon Technolgies AG, Neubiberg (DE)

( * ) Notice: Subject to any disclaimer, the term of this patent is extended or adjusted under 35 U.S.C. 154(b) by 201 days.

(21) Appl. No.: 12/030,799

(22) Filed: Feb. 13, 2008

(65) Prior Publication Data

US 2009/0201043 A1 Aug. 13, 2009

(51) Int. Cl. *G01R 31/26* (2006.01)

(52) U.S. Cl. ......... 324/762.01; 324/762.05; 324/754.03; 257/48; 257/E21.522; 438/14; 438/18

(58) Field of Classification Search ..................... 73/799; 438/17, 462; 257/355, E21.522
See application file for complete search history.

(56) References Cited

U.S. PATENT DOCUMENTS

| | | | | |
|---|---|---|---|---|
| 4,835,466 A | * | 5/1989 | Maly et al. | 324/537 |
| 5,086,652 A | * | 2/1992 | Kropp | 73/767 |
| 5,184,516 A | * | 2/1993 | Blazic et al. | 73/799 |
| 5,572,067 A | * | 11/1996 | Thalapaneni | 257/669 |
| 5,952,836 A | * | 9/1999 | Haake | 324/718 |
| 6,028,347 A | * | 2/2000 | Sauber et al. | 257/622 |
| 6,973,838 B2 | * | 12/2005 | Denis | 73/799 |
| 7,250,311 B2 | * | 7/2007 | Aoki et al. | 438/14 |
| 7,622,364 B2 | * | 11/2009 | Adkisson et al. | 438/462 |
| 7,692,247 B2 | * | 4/2010 | Woo et al. | 257/355 |
| 7,795,615 B2 | * | 9/2010 | Goebel et al. | 257/48 |
| 2004/0099877 A1 | * | 5/2004 | Towle et al. | 257/127 |
| 2005/0223812 A1 | * | 10/2005 | Denis | 73/799 |
| 2006/0189007 A1 | * | 8/2006 | Aoki et al. | 438/14 |
| 2007/0023915 A1 | * | 2/2007 | Jao et al. | 257/758 |
| 2007/0289356 A1 | * | 12/2007 | Konzelmann et al. | 73/1.06 |
| 2008/0211566 A1 | * | 9/2008 | Graovac et al. | 327/419 |
| 2009/0174426 A1 | * | 7/2009 | Matoba et al. | 324/763 |

* cited by examiner

*Primary Examiner* — Richard Isla Rodas
(74) *Attorney, Agent, or Firm* — Slater & Matsil, L.L.P.

(57) ABSTRACT

Crack sensors for semiconductor devices, semiconductor devices, methods of manufacturing semiconductor devices, and methods of testing semiconductor devices are disclosed. In one embodiment, a crack sensor includes a conductive structure disposed proximate a perimeter of an integrated circuit. The conductive structure is formed in at least one conductive material layer of the integrated circuit. The conductive structure includes a first end and a second end. A first terminal is coupled to the first end of the conductive structure, and a second terminal is coupled to the second end of the conductive structure.

30 Claims, 8 Drawing Sheets

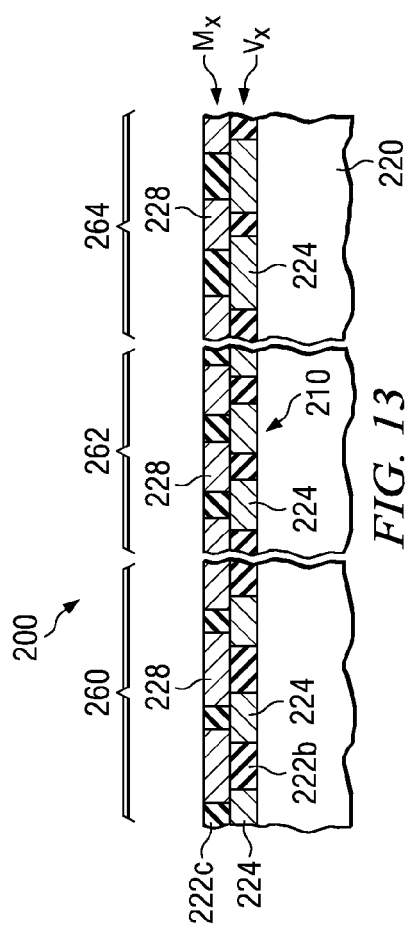
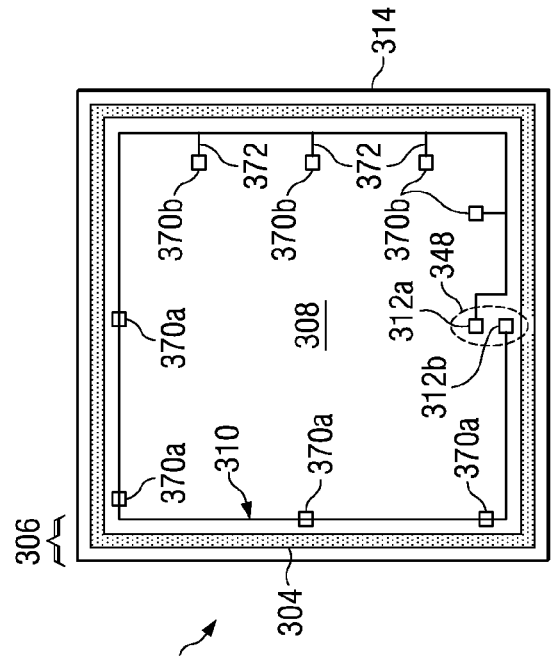
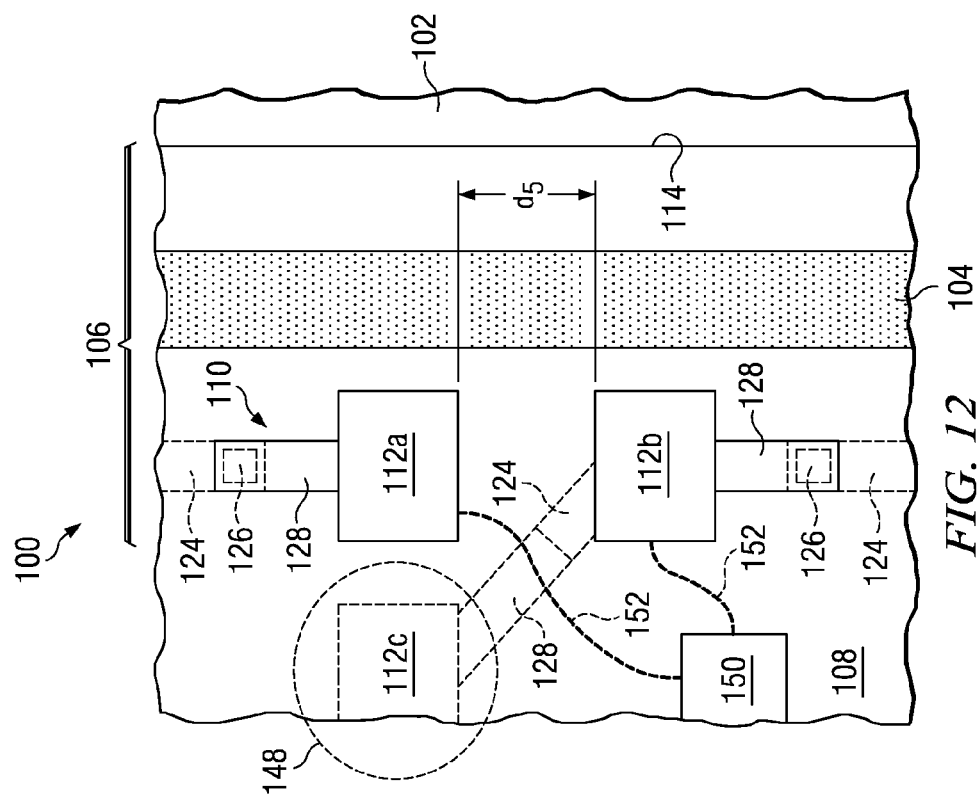

CRACK SENSORS FOR SEMICONDUCTOR DEVICES

TECHNICAL FIELD

The present invention relates generally to the fabrication of semiconductor devices, and more particularly to test structures for semiconductor devices.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual die are singulated by sawing the integrated circuits along a scribe line. The individual die are then packaged, separately, in multi-chip modules, or in other types of packaging, for example.

When the die are singulated, packaged, or handled, material layers can crack or delaminate proximate the scribe line, damaging the integrated circuits and leading to device failures. Crack prevention structures such as chip edge seal rings are often used near the edges of the die in an attempt to prevent cracking during singulation. However, crack prevention structures often fail to prevent cracks in some applications, resulting in reduced device yields.

Some cracks that may form in semiconductor devices may be difficult to detect. Other cracks may not be noticeable in the device performance until after die are packaged or used in an end application for a while, for example. The cracks may continue to perpetuate, eventually causing device failures.

Thus, what are needed in the art are methods and structures for detecting cracks in semiconductor devices.

SUMMARY OF THE INVENTION

These and other problems are generally solved or circumvented, and technical advantages are generally achieved, by preferred embodiments of the present invention, which provide novel crack sensors for semiconductor devices, semiconductor devices, methods of fabrication thereof, and methods of testing semiconductor devices.

In accordance with an embodiment of the present invention, a crack sensor for a semiconductor device includes a conductive structure disposed proximate a perimeter of an integrated circuit. The conductive structure is formed in at least one conductive material layer of the integrated circuit. The conductive structure has a first end and a second end. A first terminal is coupled to the first end of the conductive structure, and a second terminal is coupled to the second end of the conductive structure.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 12 shows another embodiment of the present invention, wherein a portion of the crack sensor overlaps another portion so that cracks are detectable on the entire perimeter of the integrated circuit;

FIG. 13 shows a cross-sectional view of another embodiment, wherein the crack sensor is formed in two conductive material layers of an integrated circuit; and FIG. 14 shows a top view of a crack sensor in accordance with another embodiment of the present invention, wherein the crack sensor is formed in a single conductive material layer of an integrated circuit.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Low dielectric constant (k) materials having a k value less than the k value of silicon dioxide and ultra-low k (ULK) materials are used in integrated circuits as back-end-of the line (BEOL) isolating materials to increase performance of semiconductor devices. However, low k and ULK materials tend to have low mechanical strength and weak adhesion properties. The die chip dicing process may create cracks or delaminations within these BEOL dielectric and other materials, penetrating into the chip and causing chip failures.

The present invention will be described with respect to preferred embodiments in a specific context, namely, crack sensors for integrated circuits. Embodiments of the invention may also be applied, however, to other applications that would benefit from crack detection structures, for example.

Embodiments of the present invention provide novel crack sensors comprising a chip edge seal ring having an integrated perimeter wiring chain for electrically detecting cracks that may penetrate into a semiconductor device. A high mechanical strength crack stop may be included proximate the crack sensors. The crack sensors may comprise a stacked via chain in some embodiments disposed around the entire chip next to the crack stop. In other embodiments, the crack sensors may comprise a single continuous conductive line formed in a single wiring level, e.g., wherein the crack sensors do not include vias. The crack sensors include two terminals for electrical read-out and testing for the presence of cracks.

Figure 1:
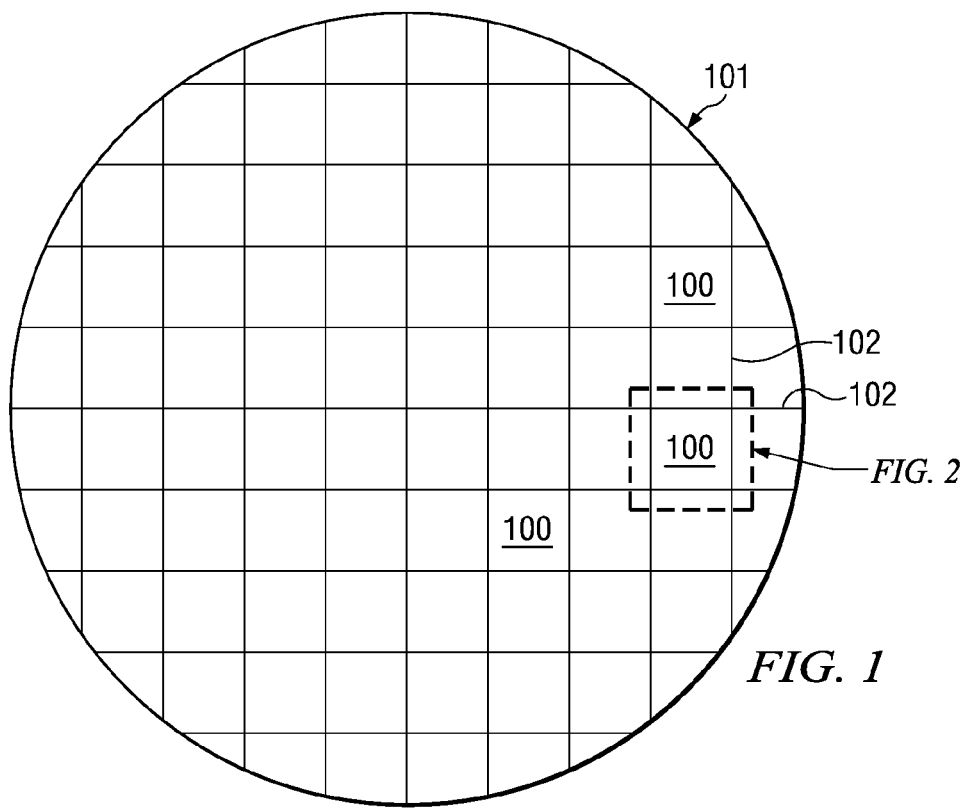
FIG. 1 is a top view of a semiconductor wafer comprising a plurality of die in accordance with an embodiment of the present invention.

With reference now to FIG. 1, there is shown a top view of a semiconductor wafer 101 comprising a plurality of die 100 in accordance with an embodiment of the present invention. The wafer 101 is generally round in a top view, and may include alignment features such as notches or straight edges, not shown. The wafer 101 includes a plurality of die 100 formed across a top surface. The die 100 may be square or rectangular in shape. Each die 100 comprises an integrated circuit and is also referred to herein as a semiconductor device or integrated circuit 100.

After fabrication, the plurality of die 100 is separated from other die 100 on the wafer 101 at scribe line regions 102 disposed between the die 100. The scribe line regions 102 are located at the perimeter of the die 100, e.g., in the kerf. At the end of the manufacturing process, a saw is used to singulate the die 100, detaching the die 100 from adjacent die 100. The saw cuts the wafer 101 at the scribe line regions 102. The singulation of the die 100 may also be performed by laser dicing or laser scribing followed by saw dicing, as examples.

Figure 2:
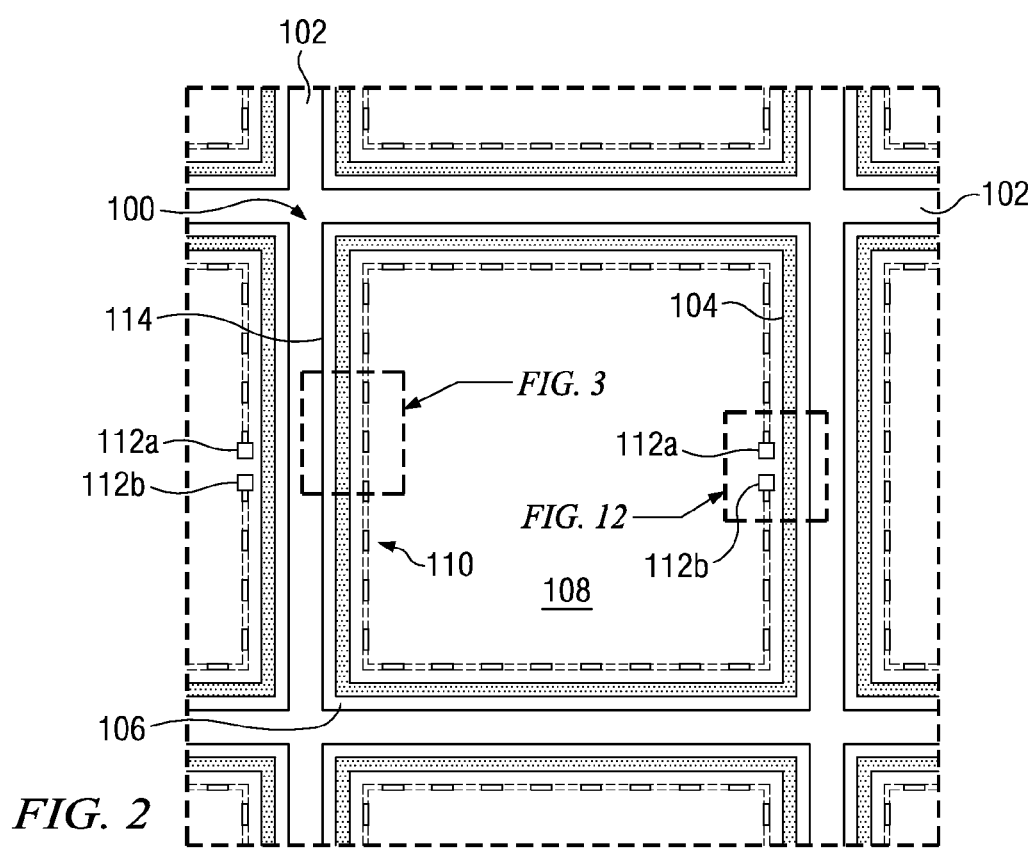
FIG. 2 is a more detailed view of a die of FIG. 1 that includes a novel crack sensor formed in at least one conductive material layer of an integrated circuit in accordance with an embodiment of the present invention.

FIG. 2 is a more detailed view of a portion of the wafer 101 shown in FIG. 1, illustrating a top view of a die 100 of FIG. 1 that includes a novel crack sensor 110 in accordance with an embodiment of the present invention. The crack sensor 110 is formed in at least one conductive material layer of the integrated circuit or die 100, for example. The crack sensor 110 may be formed proximate an optional crack barrier or crack prevention structure 104 formed along the perimeter region 106 of the die 100, as shown. The crack sensor 110 is formed between the edge 114 of the die and the interior region 108 of the integrated circuit. The crack sensor 110 is formed between the crack barrier 104 and the interior region 108 of the integrated circuit 100.

The crack sensor 110 comprises a conductive structure and is disposed proximate the perimeter region 108 of the integrated circuit 100. The conductive structure of the crack sensor 110 comprises a ring-like shape about the perimeter of the integrated circuit 100. The crack sensor 110 comprises a plurality of conductive segments formed in one or more material layers of the integrated circuit 110. The crack sensor 110 comprises a first end and a second end.

A first terminal 112a is coupled to the first end of the crack sensor 110 and a second terminal 112b is coupled to the second end of the crack sensor 110, as shown. The first terminal 112a and the second terminal 112b may comprise contacts or bond pads, for example. Alternatively, the first terminal 112a and second terminal 112b may comprise other types of electrical connections, for example. The first terminal 112a and the second terminal 112b may comprise wire bond pads or flip chip pads in some embodiments, for example.

The scribe line regions 102 may comprise a width of about 40 to 180 μm, for example, although alternatively, the scribe line regions 102 may comprise other dimensions. The crack sensor 110 may comprise a width along the edge or perimeter region 106 of the die 100 of about 300 nm or less. The crack sensor 110 width along the edge of perimeter region 106 of the die may also comprise greater than 300 nm, e.g., when the crack sensor 110 is formed in upper metallization layers of the semiconductor device 100, which may comprise larger dimensions in upper metallization layers than in lower metallization layers, for example. Alternatively, the crack sensor 110 may comprise other dimensions. The die 100 includes an interior region 108 that comprises an active region, e.g., containing functioning circuitry for the integrated circuit or semiconductor device 100. The crack sensor 110 comprises a conductive structure formed in continuous line that extends along the entire perimeter region 106 of a semiconductor device 100, e.g., between the interior region 108 and the scribe line region 102. The crack sensor 110 may be formed within one or more insulating material layers 122x (see insulating material layer 122c of FIG. 4), for example.

Figure 3:
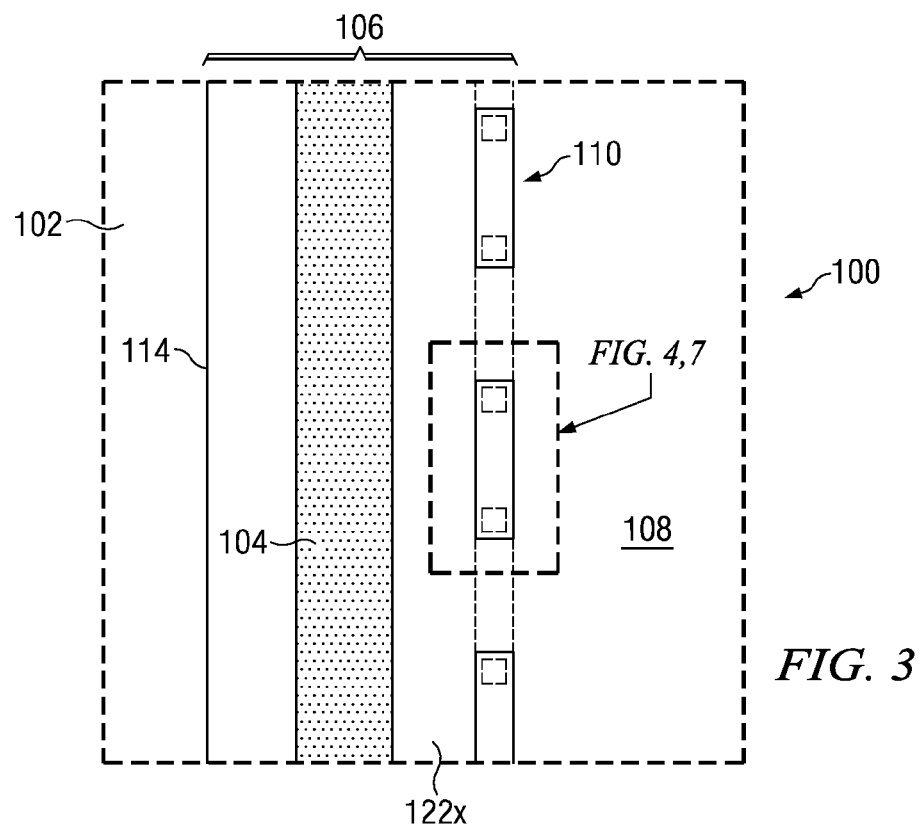
FIG. 3 shows a more detailed top view of a portion of the crack sensor of FIG. 2 in accordance with an embodiment of the present invention.

FIG. 3 shows a more detailed view of a portion of the crack sensor 110 of FIG. 2. An edge of a die 100 comprising the crack sensor 110 and the optional crack prevention structure 104 in accordance with an embodiment of the present invention are shown. The crack prevention structure 104 may comprise a metal structure formed in one or more metallization layers of the semiconductor device 100. The crack sensor 110 may be formed in the same material layers that the crack prevention structure 104 is formed in, for example. The crack sensor 110 comprises a conductive structure disposed proximate the perimeter region 106 of the integrated circuit 100. The crack sensor 110 is formed in at least one conductive material layer of the integrated circuit 100.

Figure 4:
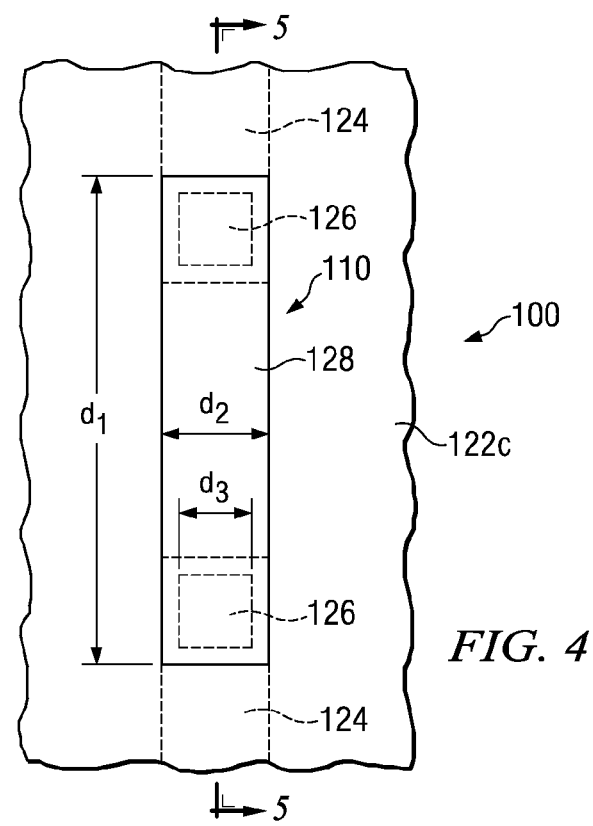
FIG. 4 shows a more detailed top view of a portion of the crack sensor shown in FIG. 3.
Figure 5:
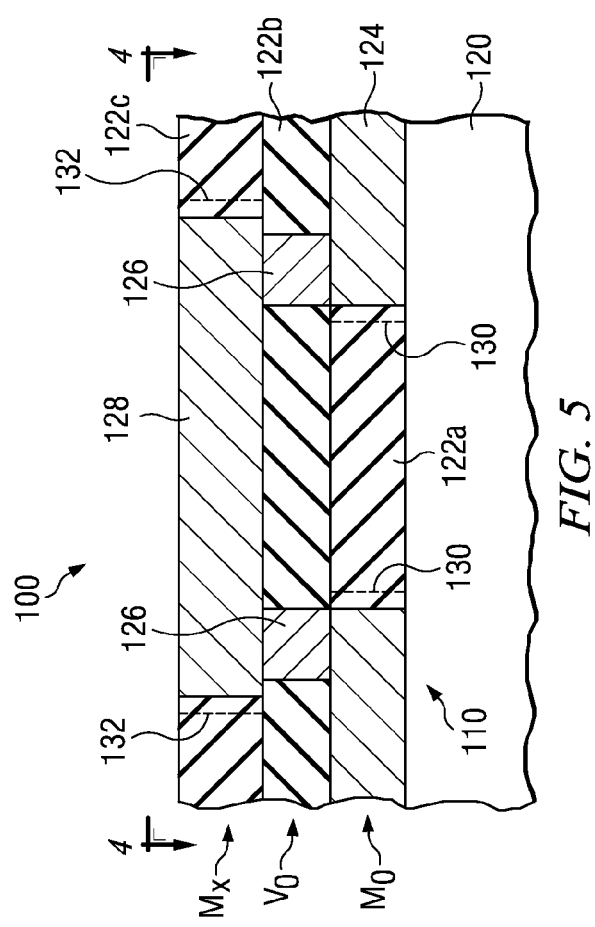
FIG. 5 shows a cross-sectional view of the portion of the crack sensor shown in FIG. 4.

In the embodiment shown in FIG. 3, the crack sensor 110 comprises a conductive structure formed in three conductive material layers $M_0$, $V_0$, and $M_x$ of the integrated circuit 100, as shown in a more detailed top view in FIG. 4 and in a cross-sectional view in FIG. 5. The crack sensor 110 comprises a plurality of first portions 124 formed in a first metallization layer $M_0$ and a plurality of second portions 128 formed in a second metallization layer $M_x$. The first portions 124 and the second portions 128 comprise conductive segments of material. The first metallization layer $M_0$ and the second metallization layer $M_x$ may comprise conductive line layers in a multi-level interconnect system of the semiconductor device 100, for example. Conductive lines for the semiconductor device 100 may be formed elsewhere on the semiconductor device 100 within the first metallization layer $M_0$ and the second metallization layer $M_x$, for example, not shown. The first metallization layer $M_0$ and the second metallization layer $M_x$ are also referred to herein as conductive material layers, for example.

Ends of the plurality of first portions 124 are coupled to ends of two of the plurality of second portions 128. Likewise, ends of the plurality of second portions 128 are coupled to ends of two of the plurality of first portions 124. The plurality of second portions 128 of the crack sensor 110 are coupled to the plurality of first portions 124 by a plurality of third portions 126 formed in a third metallization layer $V_0$, as shown. The third metallization layer $V_0$ is also referred to herein as a conductive material layer. The third metallization layer $V_0$ may comprise a via layer of a multi-layer interconnect system, for example. Vias may be formed elsewhere on the semiconductor device 100 in the third metallization layer $V_0$, for example, not shown.

The third portion 126 is coupled to ends of the first portions 124 and second portions 128, forming a serpentine chain of conductive material in the metallization layers $M_0$, $V_0$, and $M_x$, as shown in the cross-sectional view in FIG. 5. The crack sensor 110 comprising the serpentine chain of the first portions 124, second portions 128, and the third portions 126 preferably comprises a continuous line of conductive material that extends along an entire perimeter region 106 or along substantially the entire perimeter region 106 of a semiconductor device 100, e.g., disposed between the interior region 108 and the scribe line region 102.

The crack sensor 110 may be formed by first, providing a workpiece 120, as shown in the cross-sectional view of FIG. 5. The workpiece 120 may include a semiconductor substrate or semiconductor body comprising silicon or other semiconductor materials covered by an insulating layer, for example. The workpiece 120 may also include other active components or circuits, not shown. The workpiece 120 may comprise silicon oxide over single-crystal silicon, for example. The workpiece 120 may include other conductive layers or other semiconductor elements, e.g., transistors, diodes, etc. Compound semiconductors, GaAs, InP, Si/Ge, or SiC, as examples, may be used in place of silicon. The workpiece 120 may comprise a silicon-on-insulator (SOI) substrate, for example.

After active areas such as transistors, memory devices, and isolation regions (not shown) are formed in the workpiece 120, an insulating material 122a may be formed over the workpiece 120, and the first portions 124 may be formed in the insulating material 122a using a damascene process. In a damascene process, the insulating material 122a is deposited over the workpiece 120. The insulating material 122a may comprise a dielectric material such as silicon dioxide, silicon nitride, silicon oxynitride, low k materials having a dielectric constant or k value of less than about 3.9, high k materials having a dielectric constant or k value of greater than about 3.9, multiple layers, liners, and/or combinations thereof, as examples, although other materials may also be used. The insulating material 122a may be patterned for the pattern for the crack sensor 110 portion for that particular material layer (e.g., first portions 124). The insulating material 122a is patterned using lithography (e.g., using energy and a lithography mask to pattern a photosensitive material deposited over the insulating material 122a), forming spaces in the insulating material 122a.

A conductive material is deposited over the patterned insulating material 122a to fill the spaces in the insulating material 122a. The conductive material may comprise copper, aluminum, other metals, and one or more liners or barrier layers, as examples. Excess portions of the conductive material are removed from over the top surface of the insulating material 122a, using an etch process and/or chemical-mechanical polishing (CMP) process, for example, leaving the first portions 124 formed within the insulating material 122a. Several single damascene processes may be repeated to form the other metallization layers $V_0$ and $M_x$, for example. The third portions 126 may be similarly formed in the third metallization layer $V_0$, and the second portions 128 may be formed in the second metallization layer $M_x$ using single damascene processes, for example.

Alternatively, two adjacent metallization layers such as conductive material layers $V_0$ and $M_x$, for example, may be patterned using a dual damascene process to form the third portions 126 and the second portions 128, respectively. In a dual damascene technique, two metallization layers are formed at once, by patterning two insulating material layers such as layers 122c and 122b using two lithography masks and processes, and then filling the patterns within the insulating material 122c and 122b with a conductive material. The dual damascene processes may be via-first, wherein a via level such as $V_0$ is patterned before a conductive line layer such as $M_x$ is patterned, or via-last, wherein a conductive line layer such as $M_x$ is patterned before a via level such as $V_0$ is patterned, as examples. An adjacent conductive line layer such as $M_x$ and via level such as $V_0$ may be formed within a single insulating material layer 122b/122c simultaneously with a single fill process using a dual damascene process, for example.

Alternatively, the first portions 124, third portions 126, and/or the second portions 128 may be patterned using a subtractive etch process, by sequentially depositing conductive material layers over the workpiece 120 and patterning the conductive material layers to form the first portions, 124, third portions 126, and the second portions 128, and then forming an insulating material 122a, 122b, or 122c between the patterned conductive materials, for example.

The second portions 128 may comprise a length in a top view comprising a dimension $d_1$ and a width comprising a dimension $d_2$, as shown in FIG. 4. Dimension $d_1$ may comprise about 2,000 nm or less in some embodiments, or may comprise greater than about 2,000 nm in other embodiments, for example. Dimension $d_2$ may comprise about 300 nm or less in some embodiments, or may comprise greater than about 300 nm in other embodiments, for example. Alternatively, dimensions $d_1$ and $d_2$ may comprise other values. The first portions 124 may also comprise similar widths and lengths as the second portions 128, for example. The third portions 126 may comprise a length and width having a dimension $d_3$ of about 50 nm or less, in some embodiments. Alternatively, the third portions 126 may comprise via bars or elongated vias having a greater length than width $d_3$, and may be rectangular in shape, for example. Alternatively, the third portions 126 may comprise lengths and widths comprising other values.

The third portions 126 may be coupled proximate the ends of the first portions 124 and the second portions 128. In some embodiments, the ends of the first portions 124 and the second portions 128 may extend past the third portions 126 by a small amount, e.g., by a few or several nm, as shown in phantom in FIG. 5 at 130 and 132, respectively. Extending the ends of the first portions 124 and the second portions 128 past the third portions 126 ensures landing on or alignment of the third portions 126 with the first portions 124 and second portions 128, for example.

The crack sensor 110 may be used to detect cracks that may form when the die 100 are separated from the wafer 101 (see FIG. 1). To test for cracks in the integrated circuit 100, electrical contact is made to a portion of the crack sensor 110. For example, electrical contact may be made to the first terminal 112a and the second terminal 112b of the crack sensor 110. A voltage may be applied across the first terminal 112a and the second terminal 112b, for example. If a current flows or is detected during the application of the voltage to the first terminal 112a and the second terminal 112b (or other portion or region of the crack sensor 110), then the crack sensor 110 is intact and a crack has not formed that has disrupted or broken the serpentine chain conductive structure of the crack sensor 110. If current does not flow in the crack sensor 110, the crack sensor 110 has been broken, indicating the presence of a crack somewhere along the crack sensor 110. The crack sensor 110 may be tested using an ohmmeter, voltmeter, ammeter, oscilloscope, or other testing instruments, for example, by probing the first terminal 112a and the second terminal 112b with test probes or needles, for example, not shown.

Figure 11:
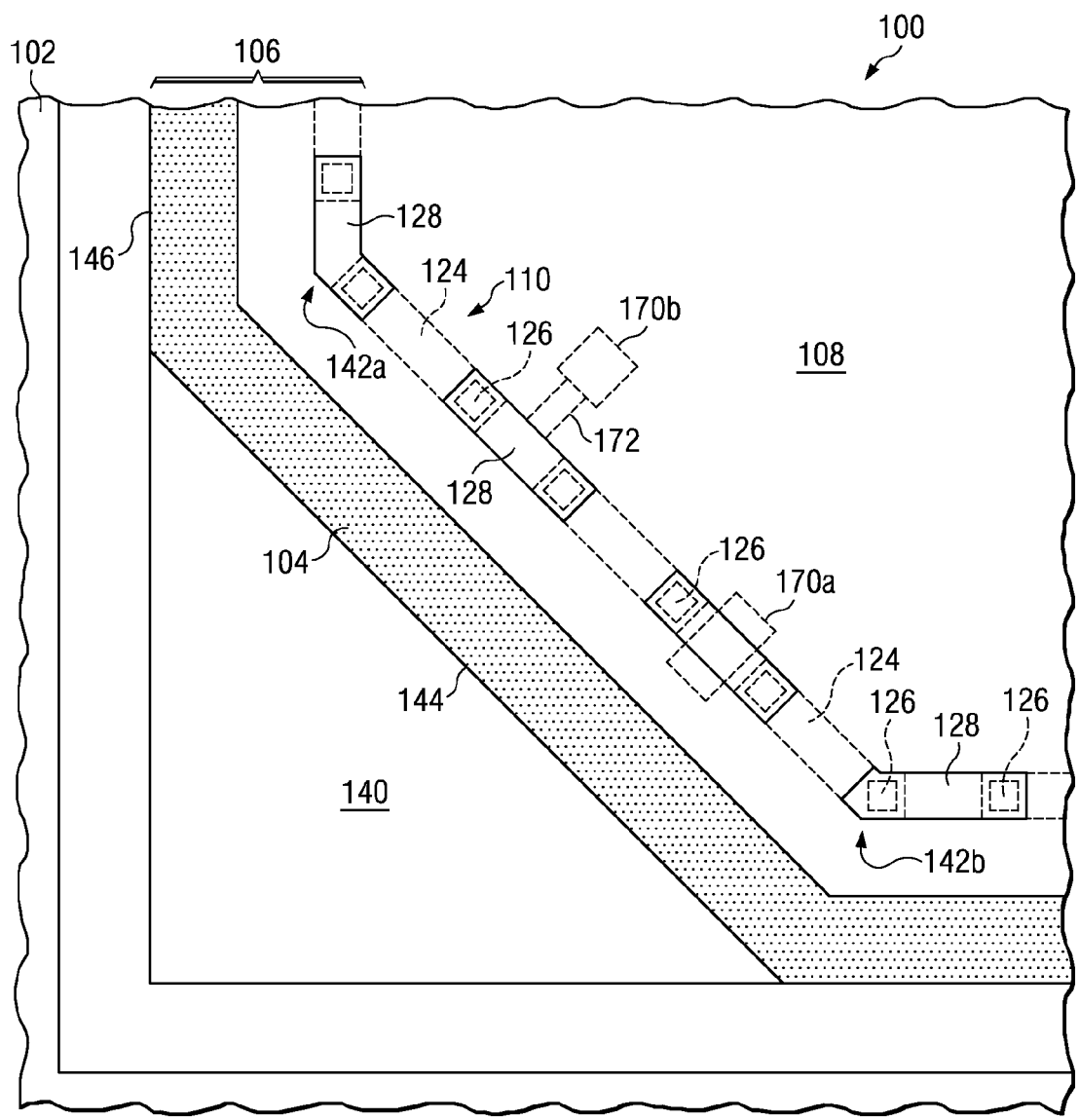
FIG. 11 shows a more detailed view of a chamfered corner of the integrated circuit and crack sensor shown in FIG. 10.

In some embodiments, an optional additional at least one third terminal 170a or 170b may be disposed along the crack sensor 110 between the first terminal 112a and the second terminal 112b, as shown in FIG. 11 in phantom, to be described further herein, so that portions or regions of the crack sensor 110 may be tested for cracks.

In the embodiment shown in FIGS. 4 and 5, a single third portion 126 is disposed between an end of each first portion 124 and an end of each second portion 128. The third portions 126 may comprise vias in the third metallization layer $V_0$. The third portions 126 may comprise the same size as vias formed elsewhere in the third metallization layer $V_0$, for example. Alternatively, the third portions 126 may comprise a different size than vias formed in other locations of the semiconductor device 100 within the third metallization layer $V_0$. The third portions 126 may comprise a minimum feature size of the semiconductor device 100 in some embodiments, for example.

The third portions 126 are advantageously small in accordance with some embodiments of the present invention, to provide a sensitive crack sensing test structure. The smaller the third portions 126 are within the third metallization layer $V_0$, the easier the third portions 126 will break if a crack forms proximate the crack sensor 110, for example.

Figure 7:
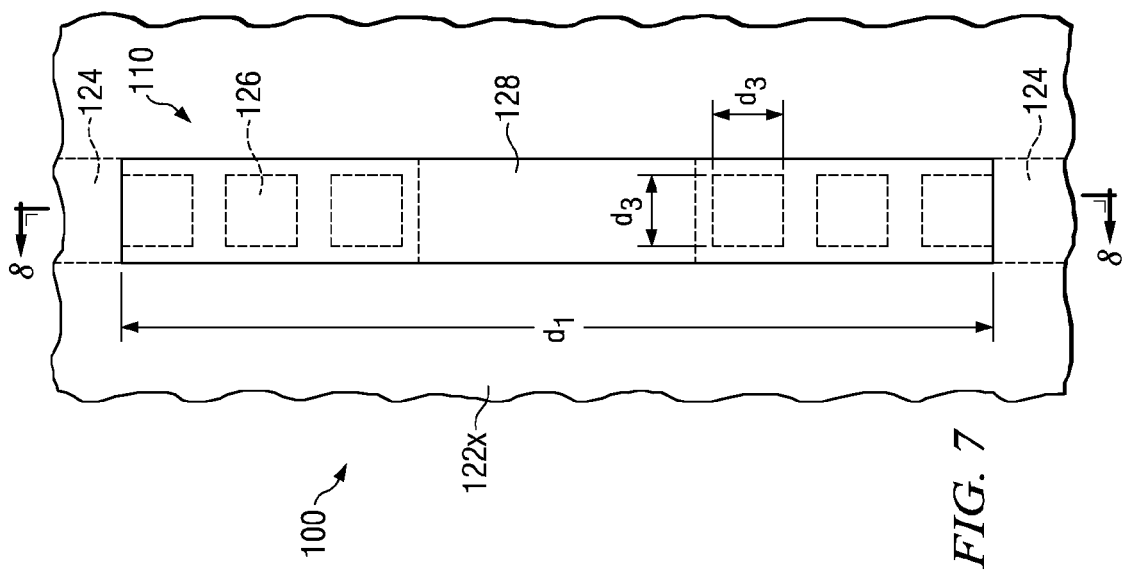
FIG. 7 shows a top view of a crack sensor in accordance with another embodiment that includes a plurality of vias disposed between conductive segments formed in conductive line layers of the integrated circuit.
Figure 6:
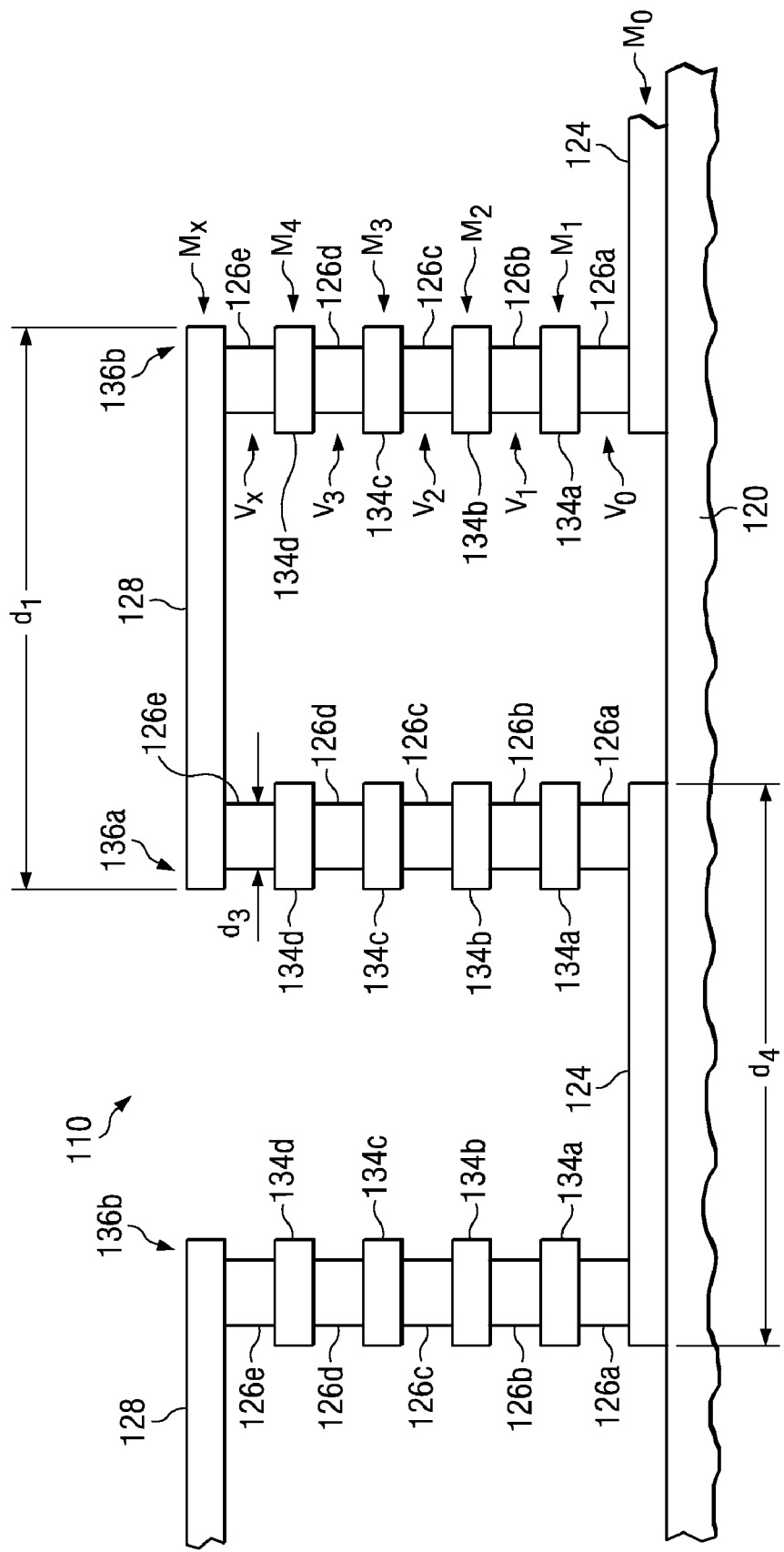
FIG. 6 shows a cross-sectional view of another embodiment, wherein the crack sensor comprises a conductive structure formed in a plurality of conductive material layers of an integrated circuit.
Figure 8:
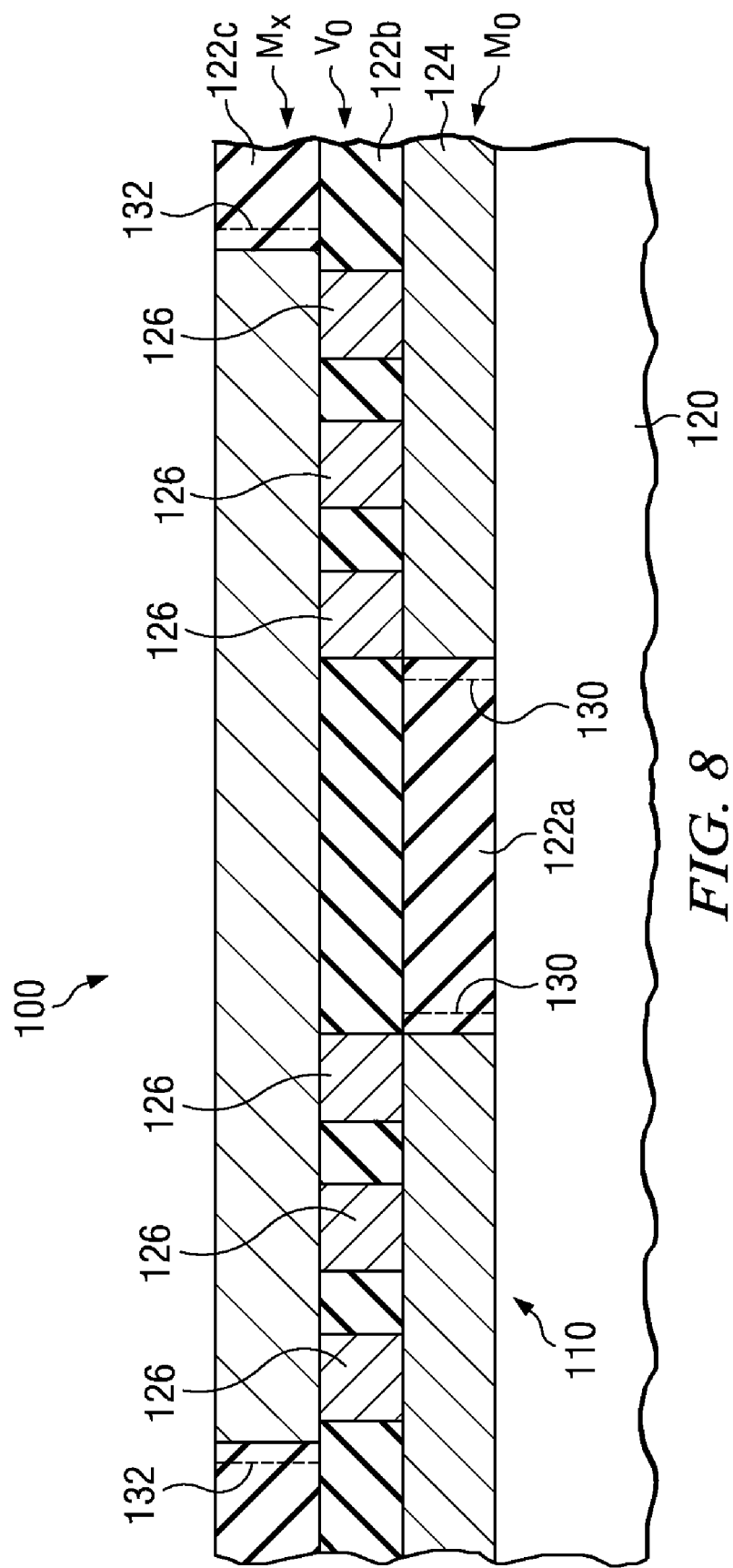
FIG. 8 shows a cross-sectional view of the crack sensor shown in FIG. 7.

In other embodiments, a plurality of third portions 126 may be coupled between the first portions 124 and the second portions 128. Two or more third portions 126a, 126b, 126c, 126d, and 126e may be disposed between ends of the first portions 124 and second portions 128 in a vertical direction of the workpiece 120, as shown in FIG. 6. Alternatively, two or more third portions 126 may be disposed between ends of the first portions 124 and second portions 128 in a horizontal direction across a surface of the workpiece 120, as shown in FIGS. 7 and 8.

In the embodiment shown in FIG. 6, the crack sensor 110 comprises a via stack 136a and 136b disposed between ends of the first portions 124 and the second portions 128. The first portions 124 of the crack sensor 110 are formed in a lower conductive line layer $M_0$. The second portions 128 of the crack sensor 110 are formed in an upper conductive line layer $M_x$. The via stacks 136a and 136b include the plurality of third portions 126a, 126b, 126c, 126d, and 126e comprising vias formed within the via layers $V_0, V_1, V_2, V_3 \ldots V_x$, as shown. The via stacks 136a and 136b also include fourth portions 134a, 134b, 134c, and 134d disposed between the third portions 126a, 126b, 126c, 126d, and 126e. The fourth portions 134a, 134b, 134c, and 134d are formed in conductive line layers $M_1, M_2, M_3$, and $M_4$ and provide electrical connection between the first portions 124 and the second portions 128. The fourth portions 134a, 134b, 134c, and 134d of the crack sensor 110 may comprise a similar size and shape as the third portions 126a, 126b, 126c, 126d, and 126e, for example.

The first portions 124 may comprise a length or dimension $d_4$ similar to the length or dimension $d_1$ of the second portions 128, for example.

In the embodiment shown in FIG. 6, the crack sensor 110 comprises a serpentine chain of the first portions 124 formed in metallization layer $M_0$, second portions 128 formed in metallization layer $M_x$, third portions 126a, 126b, 126c, 126d, and 126e formed in metallization layers $V_0, V_1, V_2, V_3 \ldots V_x$, and fourth portions 134a, 134b, 134c, and 134d formed in metallization layers $M_1, M_2, M_3$, and $M_4$. Advantageously, the third portions 126a, 126b, 126c, 126d, and 126e and fourth portions 134a, 134b, 134c, and 134d are small and may comprise a minimum feature size of the semiconductor device 100, so that they will easily break electrical connection of the continuous chain of the crack sensor 110 to indicate the presence of a crack, if a crack forms. The semiconductor device 100 and the crack sensor 110 may comprise fewer or additional metallization layers $V_0, V_1, V_2, V_3, V_x$, and $M_0, M_1, M_2, M_3, M_4$, and $M_x$ than the number that are shown in FIG. 6, for example. Note that insulating material layers such as layers 122a, 122b, and 122c shown in and described for FIG. 5 are disposed between the first portions 124, second portions 128, third portions 126a, 126b, 126c, 126d, and 126e and fourth portions 134a, 134b, 134c, and 134d, for example, not shown in FIG. 6.

FIG. 7 shows a top view of a crack sensor 110 in accordance with another embodiment that includes a plurality of vias between conductive segments formed in conductive line layers of the integrated circuit. FIG. 8 shows a cross-sectional view of the crack sensor 110 shown in FIG. 7. The crack sensor 110 includes third portions 126 that comprise a plurality of vias disposed between the first portions 124 and the second portions 128 proximate the ends of the first portions 124 and the second portions 128. The third portions 126 comprise three vias disposed between the first portion 124 and second portion 128 ends in FIG. 7; alternatively, the third portions 126 may comprise two vias or four or more vias, for example.

Figure 9:
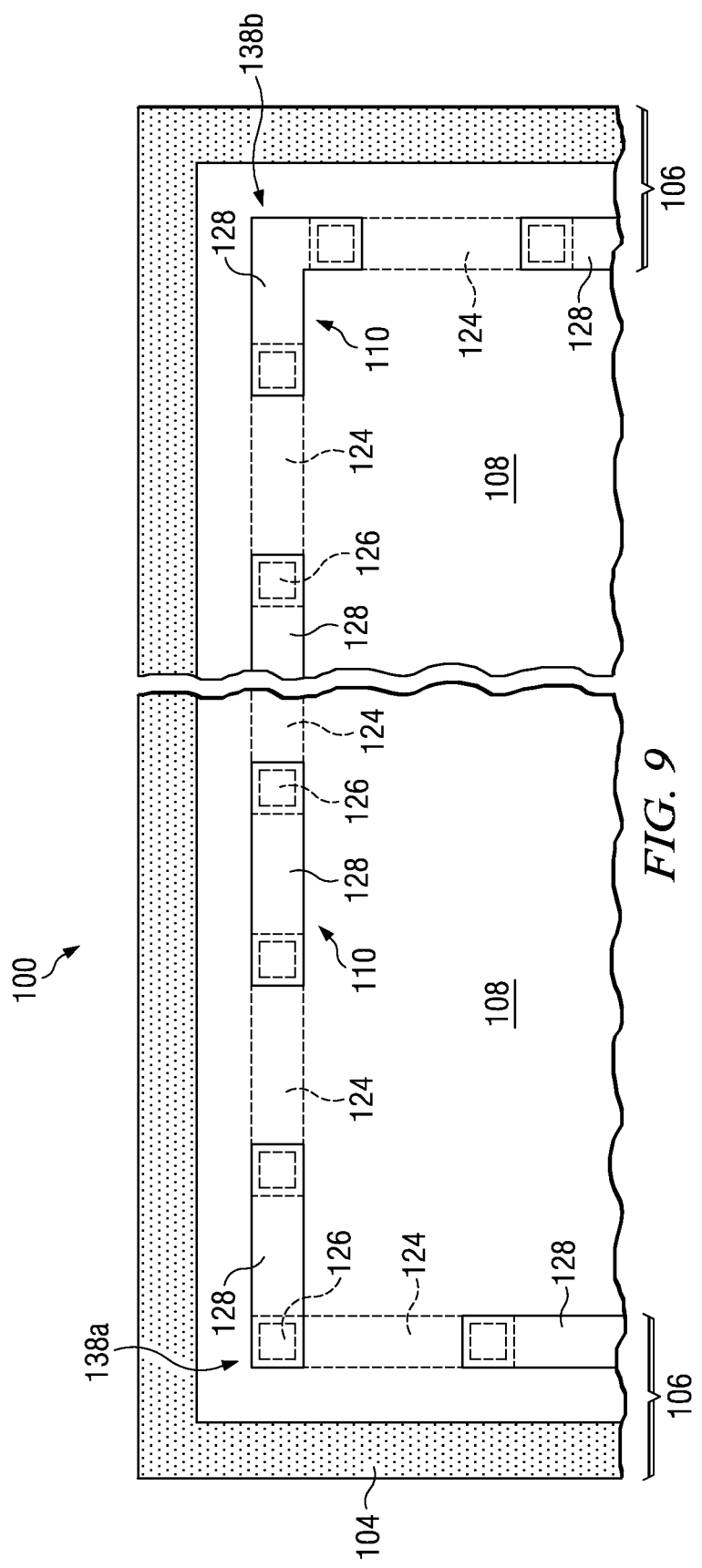
FIG. 9 shows a top view of corner regions of the crack sensor in accordance with some embodiments, wherein the die is square or rectangular.

FIG. 9 shows a top view of corner regions of the crack sensor 110. The first or second portions 124 or 128 may terminate in a corner, as shown at 138a, or the first or second portions 124 or 128 in the corners may be bent to accommodate the shape of the corner, as shown at 138b. For example, the die 100 shown in FIG. 9 is square or rectangular, and the second portion 128 in region 138b comprises an L-shape that conforms to the shape of the corner. Portions 124 or 128 of the crack sensor 110 proximate the corners of the perimeter of the integrated circuit 100 may be angled and may conform to the shape of the corners of the perimeter of the integrated circuit 100, for example.

Figure 10:
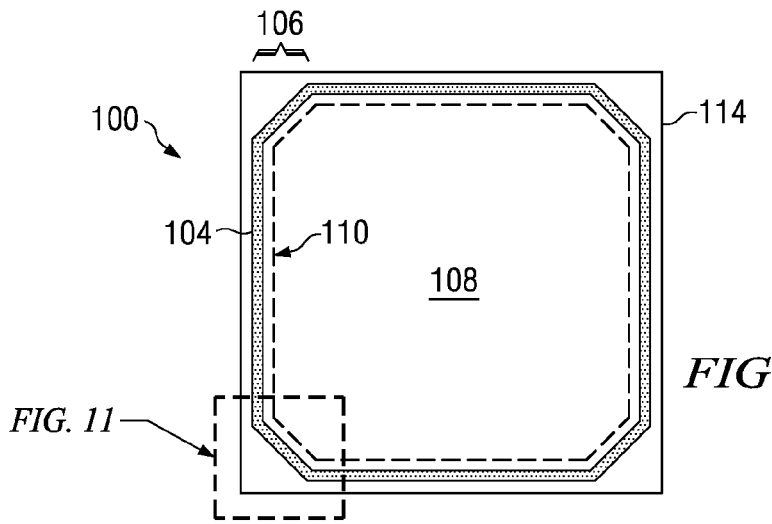
FIG. 10 shows a top view of an integrated circuit having chamfered corners, wherein the crack sensor generally comprises the shape of the integrated circuit perimeter.

FIG. 10 shows a top view of an integrated circuit 100 having chamfered corners, wherein the crack sensor 110 generally comprises the shape of the integrated circuit 100 perimeter. FIG. 11 shows a more detailed view of a chamfered corner of the integrated circuit 100 and crack sensor 110 shown in FIG. 10. The die 100 may have portions with square or rectangular edges 146 and a chamfered edge 144 at the corners, as shown. Test or calibration circuitry may be disposed in region 140 of the integrated circuit 100 proximate the chamfered corners, for example, not shown. As in the embodiment shown in FIG. 9, the first or second portions 124 or 128 may terminate in a corner as shown at 142b or may be bent to conform to the shape of the corner, as shown at 142a.

FIG. 12 shows another embodiment of the present invention, wherein a portion of the crack sensor 110 overlaps another portion of the crack sensor 110 so that cracks are detectable on the entire perimeter of the integrated circuit 100. In some embodiments, the ends of the crack sensor 110 are coupled to a first terminal 112a and a second terminal 112b, wherein the first and second terminals 112a and 112b are separated by a distance comprising dimension $d_5$. Dimension $d_5$ is preferably minimized to provide crack sensing for a large portion of the perimeter of the semiconductor device 100, for example. Dimension $d_5$ may comprise about 1,000 nm or greater in some embodiments, for example. In other embodiments, dimension $d_5$ may comprise about 1,000 nm or less, for example. Alternatively, dimension $d_5$ may comprise other values.

However, in other embodiments, the crack sensor 110 may comprise an overlap region 148. Rather than positioning the second terminal 112b at the perimeter of the integrated circuit 100, the second terminal 112c is disposed in the overlap region 148 that is proximate the first terminal 112a, moved slightly inward towards the interior region 108 of the integrated circuit 100. Additional first portions 124 and/or second portions 128 may be included in the crack sensor 110 to provide the connections of the crack sensor 110 to the second terminal 112c, as shown.

In other embodiments, an on-chip test circuit 150 may be included in the integrated circuit 100, as shown in FIG. 12. The optional on-chip test circuit 150 may be coupled to the terminals 112a and 112b (or 112c) of the crack sensor 110, e.g., by wiring 152 formed in a conductive material layer of the semiconductor device 100. The on-chip test circuit 150 may be adapted to test the crack sensor 110 in order to detect crack formation, for example.

FIG. 13 shows a cross-sectional view of another embodiment, wherein the crack sensor 210 is formed in two conductive material layers $V_x$ and $M_x$ of an integrated circuit 200. Like numerals are used for the various materials and elements that were used to describe FIGS. 1 through 12. To avoid repetition, each reference number shown in FIG. 13 is not described again in detail herein. Rather, similar materials and elements are preferably used for the various materials and elements x00, x02, x04, x06, etc. . . . shown as were used to describe FIGS. 1 through 12, where x=1 in FIGS. 1 through 12 and x=2 in FIG. 13.

In FIG. 13, a crack sensor 210 of a semiconductor device 200 is formed in two metallization layers $V_x$ and $M_x$. Third portions (e.g., such as third portions 126 shown in FIG. 5) are not included in this embodiment. Rather, the ends of the first portions 224 and second portions 228 overlap and are disposed adjacent one another to provide electrical connection of the chain of the crack sensor 210. Embodiments are illustrated wherein the plurality of first portions 224 and the plurality of second portions 228 comprise different sizes or shapes, or the same size and shape. For example, in FIG. 13 in region 260, the second portions 228 are longer than the first portions 224. In region 262, the second portions 228 are substantially the same size as the first portions 224. In region 264, the second portions 228 are shorter than the first portions 224. Combinations of the various sizes may be used for the first portions 224 and second portions 228 within a single crack sensor 210 of a semiconductor device 200, e.g., in a single damascene integration scheme.

FIG. 14 shows a top view of a crack sensor 310 in accordance with another embodiment of the present invention, wherein the crack sensor 310 is formed in a single conductive material layer of an integrated circuit. Again, like numerals are used for the various elements that were used to describe the previous figures, and to avoid repetition, each reference number shown in FIG. 14 is not described again in detail herein. The crack sensor 310 may be formed in a single conductive material layer, e.g., in a conductive line layer or a via layer of the semiconductor device 300. Rather than comprising a serpentine chain of conductive material formed in various conductive material layers as in the other embodiments shown and described herein, a single loop of conductive material is used as a crack sensor in the embodiment shown in FIG. 14. The crack sensor 310 comprises a conductive structure comprising a conductive line formed in at least one conductive material layer of the integrated circuit. The conductive structure may be formed in two or more conductive material layers of the integrated circuit, for example, not shown, e.g., comprising two or more continuous lines disposed on top of one another. The terminals 312a and 312b may be positioned in an overlap region 348 to provide crack sensing for the entire perimeter region 306 of the integrated circuit 300, as shown. Alternatively, the terminals 312a and 312b may be spaced apart by a dimension $d_5$ as shown in FIG. 12.

Also shown in phantom in FIG. 14 are optional third terminals 370a and 370b that may be coupled to the crack sensor 310 to allow testing for cracks in regions of the crack sensor 310 rather than the entire crack sensor 310 conductive structure. The third terminals 370a and 370b may comprise terminals such as the contact pads or test pads described for the first and second terminals 112a and 112b, for example.

The optional third terminals 370a or 370b may be disposed along the crack sensor 310 at predetermined intervals between the first terminal 312a and the second terminal 312b, for example. The optional third terminals 370a and 370b allow for the determination of the position of the crack within the crack sensor 310. Locations of the crack or cracks along the periphery of the die 300 may be determined by the use of the optional third terminals 370a and 370b along the crack sensor 310 ring-like structure. The third terminals 370a and 370b provide the ability to measure and test for cracks in regions between the terminals 370a or 370b rather than over the entire periphery of the die 300, for example.

The optional third terminals 370a may be disposed on or over portions of the crack sensor 310, as shown at 370a. Alternatively, the third terminals 370b may be coupled to the crack sensor 310 by a conductive segment of material 372. The crack sensor 310 may be tested for the presence of cracks between the first terminal 312a and the second terminal 312b, between the first terminal 312a and a third terminal 370a or 370b, between the second terminal 312b and a third terminal 370a or 370b, or between two third terminals 370a and 370b, for example.

The crack sensor 310 may include at least one third terminal 370a and 370b adapted to provide testing for the presence of cracks in regions of the crack sensor 310. At least one third terminal 370a or 370b may also be included in the previous embodiments of the crack sensors 110 or 210 described herein, for example. As one example, third terminals 170a and 170b are shown in phantom in the top view of FIG. 11. The optional third terminals 170a may be disposed on or over the second portions 128 of the crack sensor 110, as shown at 170a in phantom. Alternatively, the third terminals 170b may be coupled to the crack sensor 110 by a conductive segment of material 172, also shown in phantom.

The novel crack sensors 110, 210, and 310 described herein are preferably formed in at least one via layer and/or at least one conductive line layer of a semiconductor device 100, 200, or 300. In other embodiments, the crack sensor 310 is formed in at least one conductive line layer, for example. In other embodiments, the novel crack sensors 110, 210, and 310 are formed in at least two conductive material layers of a semiconductor device. In other embodiments, the crack sensor may be formed in at least one via layer and at least one conductive line layer below and above the at least one via layer, for example.

The novel crack sensors 110, 210, and 310 may be formed within the metallization layers $V_0, V_1, V_2, V_3$ and $V_x$ and $M_0$, $M_1, M_2, M_3, M_4$ and $M_x$ of a semiconductor device 100, 200, and 300, and may be formed using the same lithography mask and lithography processes used to form the conductive lines and vias for the semiconductor devices 100, 200, and 300, for example. Thus, no additional lithography masks or lithography steps are required to manufacture some embodiments of the present invention, advantageously. The pattern for the crack sensors 110, 210, and 310 may be included in existing mask sets for the semiconductor device 100, 200, and 300, for example.

The crack sensors 110, 210, and 310 advantageously may comprise third portions 126 that are small and easily crack or break the continuous conductive chain of the crack sensors, to detect a crack proximate the perimeter regions 106 and 306 of the semiconductor devices 100, 200, and 300. The crack sensors 110, 210, and 310 are sacrificial structures used to test for cracks or delaminations, electrically detecting cracks that may perpetuate into a chip. If a crack is detected, chip failure, imminent chip failure, or eventual chip failure may result, for example. The crack sensors 110, 210, and 310 may be formed using damascene processes, dual damascene processes, multiple damascene processes, subtractive etch processes, or combinations thereof, as examples.

The crack sensors 110, 210, and 310 may be formed in every metallization layer $V_0, V_1, V_2, V_3$ and $V_x$ and $M_0, M_1$, $M_2, M_3, M_4$ and $M_x$ of a semiconductor device 100, 200, and 300, or in some of the metallization layers, for example. The crack sensors 110, 210, and 310 may be formed at the periphery of a die 100, 200, and 300, as shown in the drawings. Alternatively, in other embodiments, the crack sensors 110, 210, and 310 may be formed in one or more metallization layers $V_0$ through $V_x$ and $M_0$ through $M_x$ of the semiconductor devices 100, 200, and 300, for example.

Cracks may advantageously be detected within a via layer or level $V_x$, or in a conductive line layer $M_x$ of a semiconductor device 100, 200, or 300, or both, using the novel crack sensors 110, 210, and 310 described herein, for example.

In some embodiments of the present invention, the crack sensors 110, 210, and 310 may be formed during the formation of metallization layers such as conductive line layers $M_0$, $M_1, M_2, M_3, M_4$ and $M_x$ and via layers $V_0, V_1, V_2, V_3$ and $V_x$ shown in the figures. Alternatively, the crack sensors 110, 210, and 310 described herein may be formed after fabrication of the other material layers of the integrated circuits 100, 200, or 300.

Embodiments of the present invention include crack sensors 110, 210, and 310 for integrated circuits, semiconductor devices 100, 200, and 300 comprising the crack sensors 110, 210, and 310, and methods of manufacturing semiconductor devices 100, 200, and 300 including the crack sensors 110, 210, and 310 described herein. Embodiments of the present invention also include methods of testing semiconductor devices 100, 200, and 300 using the novel crack sensors 110, 210, and 310 described herein, for example.

The crack sensors 110, 210, and 310 described herein may be used to detect cracks and/or delaminations that may be caused by the chip dicing process or due to packaging stress, for example.

The crack sensors 110, 210, and 310 are shown and described herein as being formed at perimeter regions 106, 206, and 306 of the semiconductor devices 100, 200, and 300, e.g., proximate the scribe line regions 102, 202, and 302.

Alternatively, the crack sensors 110, 210, and 310 described herein may also be formed in central regions 108, 208, and 308 of semiconductor devices 100, 200, and 300 in some applications, for example, not shown in the drawings.

Advantages of embodiments of the invention include providing novel crack sensors 110, 210, and 310 that detect cracking of integrated circuits or semiconductor devices 100, 200 and 300 during singulation processes, packaging processes, or handling, e.g., when the novel crack sensors 110, 210, and 310 are placed in perimeter regions 106, 206, and 306 proximate the scribe line regions 102, 202, and 302.

The novel crack sensors 110, 210, and 310 enable the early screening of failed chips after packaging and burn-in tests of the integrated circuits 100, 200, and 300, and also when the semiconductor devices 100, 200, and 300 are used in an end application, e.g., in the field.

The crack sensors 110, 210, and 310 are particularly useful in semiconductor devices 100, 200, and 300 that have low k or ultra low k insulating materials that may have very weak mechanical properties and may have more of a tendency to crack or delaminate than conventional insulating materials, for example. The crack sensors 110, 210, and 310 may not be formed (although in some embodiments, they may be) in more conventional silicon dioxide-based insulating material layers of the semiconductor devices 100, 200, and 300, for example. However, in other embodiments, the crack sensors 110, 210, and 310 may be formed in every metallization layer of a semiconductor device or in conductive material layers comprising other types of insulating materials.

In some embodiments, the crack sensors 110, 210, and 310 may be formed proximate crack barrier structures, providing a crack stop or crack barrier design having built-in diagnostic capabilities, for example. In other embodiments, the crack sensors 110, 210, and 310 comprise stacked via chains around the perimeter of an entire die 100, 200, and 300, for example. The links between the first portions 124 and the second portions 128 may comprise single or multiple vias disposed horizontally across a surface of a workpiece 120 or 220, or multiple vias stacked in a vertical direction. The stacked vias (e.g., third portions 126, 126a, 126b, 126c, 126d, and 126e and fourth portions 134a, 134b, 134c, and 134d) comprise delamination and crack-sensitive sacrificial structures that are useful in detecting cracks within the crack sensors 110, 210, and 310 in some embodiments, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a conductive structure disposed proximate a perimeter of an integrated circuit, the conductive structure being formed in at least one conductive material layer of the integrated circuit, the conductive structure beginning at a first end and ending at a second end, the conductive structure completely encircling the integrated circuit between the first end and the second end, wherein the first end is electrically coupled to the second end only through the encircling;
a first terminal coupled to the first end of the conductive structure;
a second terminal coupled to the second end of the conductive structure, the conductive structure, the first and the second terminals forming a crack sensor; and
a crack stop layer disposed adjacent the conductive structure, wherein the conductive structure is disposed between the crack stop layer and an interior region of the integrated circuit.

2. The semiconductor device according to claim 1, wherein the conductive structure comprises a plurality of first portions disposed in a first conductive material layer and a plurality of second portions disposed in a second conductive material layer, wherein the plurality of first portions is coupled to at least one of the plurality of second portions.

3. The semiconductor device according to claim 2, wherein the conductive structure comprises a serpentine chain of the plurality of first portions and the plurality of second portions.

4. The semiconductor device according to claim 2, wherein the plurality of first portions are substantially the same size as the plurality of second portions.

5. The semiconductor device according to claim 2, wherein the conductive structure further comprises a plurality of third portions disposed in a third conductive material layer, the plurality of third portions being disposed between the plurality of first portions and the plurality of second portions.

6. The semiconductor device according to claim 5, wherein the conductive structure comprises a serpentine chain of the plurality of first portions, the plurality of second portions, and the plurality of third portions, wherein each of the plurality of third portions is coupled between one of the plurality of first portions and one of the plurality of second portions.

7. The semiconductor device according to claim 1, wherein the conductive structure comprises a conductive line in at least one conductive material layer of the integrated circuit.

8. The semiconductor device according to claim 1, wherein the conductive structure borders the perimeter completely.

9. The semiconductor device according to claim 1, wherein the second terminal overlaps the first terminal along a first direction perpendicular to a normal to a top surface of the integrated circuit.

10. The semiconductor device according to claim 9, wherein the conductive structure is oriented along a second direction perpendicular to the first direction at the first terminal.

11. The semiconductor device according to claim 1, wherein the second terminal is closer to the crack stop layer than the first terminal.

12. The semiconductor device according to claim 1, wherein a first half of the conductive structure is oriented substantially along a first direction in encircling the integrated circuit, and wherein a remaining half of the conductive structure is oriented substantially along a second direction in encircling the integrated circuit, wherein the first direction is perpendicular to the second direction.

13. The semiconductor device according to claim 1, wherein the conductive structure is rectangular in shape.

14. The semiconductor device according to claim 1, wherein the second end of the conductive structure is closer to the crack stop layer than the first end of the conductive structure.

15. A semiconductor device, comprising:
an integrated circuit, the integrated circuit having a perimeter; and
a crack sensor disposed around and on the integrated circuit proximate the perimeter of the integrated circuit, the crack sensor comprising a conductive structure, the conductive structure beginning at a first end and ending at a second end, wherein the conductive structure between the first end and the second end completely encircles the integrated circuit, wherein the conductive structure comprises a plurality of discontinuous line segments in a first metal level of the integrated circuit, a plurality of discontinuous line segments in a second metal level of the integrated circuit, and a plurality of vias connecting the plurality of discontinuous line segments in the first metal level to the plurality of discontinuous line segments in the second metal level thereby forming a continuous conductor between the first and the second ends, wherein the crack sensor includes a first terminal coupled to the first end of the conductive structure and a second terminal coupled to the second end of the conductive structure, and wherein the first end is electrically coupled to the second end only through the encircling conductive structure between the first and the second ends.

16. The semiconductor device according to claim 15, wherein the perimeter of the integrated circuit comprises corners, wherein the portions of the crack sensor proximate the corners of the perimeter of the integrated circuit are angled and conform to the shape of the corners of the perimeter of the integrated circuit, or wherein the portions of the crack sensor proximate the corners of the perimeter of the integrated circuit terminate at the corners.

17. The semiconductor device according to claim 15, wherein the conductive structure of the crack sensor comprises a serpentine chain of conductive material disposed in a plurality of conductive material layers of the integrated circuit.

18. The semiconductor device according to claim 15, wherein the integrated circuit comprises a crack prevention structure disposed proximate the perimeter of the integrated circuit, wherein the crack sensor is disposed proximate the crack prevention structure, the crack sensor being disposed between an interior region of the integrated circuit and the crack prevention structure.

19. The semiconductor device according to claim 15, wherein the conductive structure borders the perimeter of the integrated circuit completely.

20. The semiconductor device according to claim 15, wherein the second end of the conductive structure is closer to a side of the integrated circuit than the first end of the conductive structure.

21. A semiconductor device, comprising:
an integrated circuit, the integrated circuit having a perimeter;
a crack stop barrier disposed on the perimeter of the integrated circuit; and
a crack sensor disposed along the perimeter, the crack sensor disposed on the integrated circuit between the crack stop barrier and an inner region of the integrated circuit, the crack sensor comprising a plurality of serpentine segments disposed adjacent and parallel to the crack stop barrier and connected together to form a conductive line beginning at a first end and ending at a second end, wherein a first pad is coupled to the first end and a second pad is coupled to the second end, wherein the second pad overlaps with the first pad along a first direction so that the plurality of serpentine segments between the first pad and the second pad borders the perimeter completely, wherein the first pad is electrically coupled to the second pad only through the plurality of serpentine segments between the first end and the second end.

22. The semiconductor device according to claim 21, wherein a first set of the plurality of serpentine segments is oriented substantially along the first direction around the integrated circuit and wherein a remaining second set of the plurality of serpentine segments is oriented substantially along a second direction around the integrated circuit, and wherein the first direction is perpendicular to the second direction.

23. The semiconductor device according to claim 21, wherein a single serpentine segment of the plurality of serpentine segments comprises:
- a first discontinuous line segment in a first metal level of the integrated circuit;
- a second discontinuous line segment in a second metal level of the integrated circuit; and
- a plurality of vias coupling the first discontinuous line segment to the second discontinuous line segment thereby forming the single serpentine segment.

24. The semiconductor device according to claim 21, wherein the second pad is closer to the crack stop barrier than the first pad.

25. A semiconductor device, comprising:
- an integrated circuit, the integrated circuit having a perimeter;
- a crack stop barrier disposed on the perimeter of the integrated circuit; and
- a crack sensor disposed along the perimeter, the crack sensor disposed on the integrated circuit between the crack stop barrier and an inner region of the integrated circuit, the crack sensor comprising a plurality of serpentine segments disposed adjacent and parallel to the crack stop barrier and connected together to form a conductive line beginning at a first end and ending at a second end, wherein a first pad is coupled to the first end and a second pad is coupled to the second end, wherein the second pad overlaps with the first pad along a first direction so that the plurality of serpentine segments coupling the first pad with the second pad borders the perimeter completely, wherein the first pad is electrically coupled to the second pad only through the plurality of serpentine segments between the first end and the second end; and
- a third pad coupled to the plurality of serpentine segments and disposed on an electrical path between the first and the second pads.

26. The semiconductor device according to claim 25, wherein the conductive line is oriented substantially along the first direction and a second direction around the integrated circuit, wherein the first direction is perpendicular to the second direction, and wherein the conductive line is oriented along the second direction at the first end.

27. The semiconductor device according to claim 25, wherein a single serpentine segment of the plurality of serpentine segments comprises:
- a first discontinuous line segment in a first metal level of the integrated circuit;
- a second discontinuous line segment in a second metal level of the integrated circuit; and
- a plurality of vias coupling the first discontinuous line segment to the second discontinuous line segment thereby forming the single serpentine segment.

28. The semiconductor device according to claim 25, wherein the second pad is closer to the crack stop barrier than the first pad.

29. A semiconductor device, comprising:
- an integrated circuit, the integrated circuit having a perimeter;
- a crack stop barrier disposed on the perimeter of the integrated circuit; and
- a crack sensor disposed along the perimeter, the crack sensor disposed on the integrated circuit between the crack stop barrier and an inner region of the integrated circuit, the crack sensor comprising a plurality of serpentine segments disposed adjacent and parallel to the crack stop barrier and connected together to form a conductive line beginning at a first end and ending at a second end, wherein a first pad is coupled to the first end and a second pad is coupled to the second end, wherein the second pad overlaps with the first pad along a first direction so that the plurality of serpentine segments coupling the first pad with the second pad borders the perimeter completely, wherein the first pad is electrically coupled to the second pad only through the plurality of serpentine segments between the first end and the second end, and wherein a single serpentine segment of the plurality of serpentine segments comprises
- a first discontinuous line segment in a first metal level of the integrated circuit,
- a second discontinuous line segment in a second metal level of the integrated circuit, and
- a plurality of vias coupling the first discontinuous line segment to the second discontinuous line segment thereby forming the single serpentine segment.

30. The semiconductor device according to claim 29, wherein the second pad is closer to the crack stop barrier than the first pad.

* * * * *